(12) United States Patent  (10) Patent No.: US 8,799,866 B2
Bullard et al.  (45) Date of Patent: Aug. 5, 2014

(54) AUTOMATIC GENERATION OF USER INTERFACES

(75) Inventors: Joel A. Bullard, Seattle, WA (US); Arnaldo Carreno-Fuentes, San Jose, CA (US); Margaret H. Cho, Arlington, VA (US); Michael G. Collins, Los Gatos, CA (US); Clemens Drews, San Jose, CA (US); Jalal U. Mahmud, San Jose, CA (US); Mark D. Vickstrom, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 445 days.

(21) Appl. No.: 13/149,393

(22) Filed: May 31, 2011

(65) Prior Publication Data

US 2012/0311471 A1  Dec. 6, 2012

(51) Int. Cl.
*G06F 9/44* (2006.01)
*G06F 11/36* (2006.01)

(52) U.S. Cl.
CPC ........ *G06F 11/3688* (2013.01); *G06F 11/3684* (2013.01); *G06F 11/3668* (2013.01)
USPC ......................................................... 717/125

(58) Field of Classification Search
CPC ..................................................... G06F 11/36
USPC ................................................. 717/124–135
See application file for complete search history.

(56) References Cited

U.S. PATENT DOCUMENTS

| | | | |
|---|---|---|---|
| 6,701,514 B1 | 3/2004 | Haswell et al. | |
| 7,051,303 B1 | 5/2006 | Lam et al. | |
| 7,051,304 B2 | 5/2006 | Bozkaya et al. | |
| 7,167,870 B2 | 1/2007 | Avvari et al. | |
| 7,272,822 B1 | 9/2007 | Riggins et al. | |
| 7,373,300 B1 | 5/2008 | Bangalore et al. | |

(Continued)

FOREIGN PATENT DOCUMENTS

| CN | 101377759 A | 3/2009 |
|---|---|---|
| EP | 1850230 A2 | 10/2007 |

(Continued)

OTHER PUBLICATIONS

W3C, "Document Object Model (DOM) Level 1 Specification", 1998, retrieved from http://www.w3.org/TR/1998/REC-DOM-Level-1-19981001/DOM.pdf, 169 pages.*

(Continued)

*Primary Examiner* — Ted T Vo
(74) *Attorney, Agent, or Firm* — Fleit Gibbons Gutman Bongini & Bianco PL; Thomas Grzesik

(57) ABSTRACT

Embodiments of the invention relate automatically generating and positioning user interface elements. In one embodiment, user interface elements are automatically generated and positioned on a user interface. At least one test script associated with a user interface is received as an input. The test script includes a set of test instructions. Each test instruction in the set of test instructions is parsed. A set of user interface elements referenced by each test instruction is identified in response to the parsing. A determination is made as to whether the user interface includes the set of user interface elements. At least one user interface element in the set of user interface elements is generated in response to the user interface failing to include the at least one user interface element.

14 Claims, 15 Drawing Sheets

(56) References Cited

U.S. PATENT DOCUMENTS

| | | | |
|---|---|---|---|
| 7,496,890 | B2 | 2/2009 | Miller et al. |
| 7,587,411 | B2 | 9/2009 | De Vorchik et al. |
| 7,590,973 | B1 | 9/2009 | Barry et al. |
| 7,840,944 | B2 | 11/2010 | Brunswig et al. |
| 2004/0107415 | A1 | 6/2004 | Melamed et al. |
| 2005/0204343 | A1 | 9/2005 | Kisamore et al. |
| 2005/0223360 | A1 | 10/2005 | Seeman et al. |
| 2006/0048100 | A1 | 3/2006 | Levy et al. |
| 2007/0283322 | A1 | 12/2007 | Hsu et al. |
| 2008/0086627 | A1 | 4/2008 | Splaine et al. |
| 2009/0187828 | A1 | 7/2009 | Roll |
| 2009/0217302 | A1 | 8/2009 | Grechanik et al. |
| 2010/0138762 | A1 | 6/2010 | Reghetti et al. |

FOREIGN PATENT DOCUMENTS

| | | |
|---|---|---|
| JP | 3262045 | 11/1991 |
| JP | 7084778 A | 3/1995 |
| JP | 9054709 | 2/1997 |
| WO | WO2005033909 A2 | 4/2005 |

OTHER PUBLICATIONS

Lallier, K.W., et al., "Relating Logic Design to Physical Geometry in LSI Chip," IBM Technical Disclosure Bulletin, vol. 19, No. 6, Nov. 1976.

Fertalj, K., et al., "An Application Generator Based on UML Specification," Proceedings of the 8th WSEAS International Conference on Applied Computer Science (ASC'08), ISSN: 1790-5109, ISBN: 978-960-474-028-4, IEEE Transactions on Software Engineering, 29(6), 2003.

Herbsleb, J.D., et al., "An Empirical Study of Speed and Communication in Globally Distributed Software Development," IEEE Transactions on Software Engineering, vol. 29, No. 6, Jun. 2003, 0098-5589/03.

Lau, T., et al., "Interpreting Written How-To Instructions," in IJXAI'09, pp. 1433-1438, 2009.

Little, G., et al., "Koala: Capture, Share, Automate, Personalize Business Processes on the Web," in CHI'07, pp. 943-946, 2007.

Mahmud, J., et al., "Lowering the Barriers to Website Testing with CoTester," IUI 2010, Feb. 7-10, 2010, Hong Kong, China, Copyright 2010 ACM 978-1-60558-515—Apr. 10, 2002.

McMaster, S., et al., "An Extensible Heuristic-Based Framework for GUI Test Case Maintenance," TESTBEDS, 2009.

Memon, A.M., "Automatically Repairing Event Sequence-Based GUI Test Suites for Regression Testing," ACM Transactions on Computational Logic, vol. V, No. N, Sep. 2007, pp. 1-35.

Olsen, D.R., Jr., et al., "Syngraph: A Graphical User Interface Generator," Computer Graphics, vol. 17, No. 3, Jul. 1983, ACM 0-89791-109-1/83/007/0043.

Whalen, M.W., et al., "On the Requirements of High-Integrity Code Generation," In 4th IEEE International Symposium on High Assurance Systems Engineering, 1999.

U.S. Utility Patent Application entitled "Interactive Semi-Automatic Test Case Maintenance," inventors Joel A. Bullard, et al., filed on May 31, 2011.

Mahmud, J., et al., "New Development Tools for the New Web—Increasing Access and Efficiency of Web Development," WWW2011, Mar. 28-Apr. 1, 2011, Hyderbad, India, Copyright 2011 ACM X-XXXXX-XX-X/XX/XX.

Mahmud, J., et al., "Test Driven Development for the Web—Increasing Efficiency of Web Development," UIST'11, Oct. 16-19, 2011, Santa Barbara, CA., USA, Copyright 2011, ACM 978-1-4503-0716—Jan. 11, 2010.

Non-Final Office Action dated May 23, 2013 received for U.S. Appl. No. 13/569,626.

Non-Final Office Action dated May 24, 2013 received for U.S. Appl. No. 13/149,438.

Final Office Action dated Oct. 3, 2013 received for U.S. Appl. No. 13/569,626.

Final Office Action dated Oct. 3, 2013 received for U.S. Appl. No. 13/149,438.

Leshed, G. et al. "Coscripter: automating and sharing how-to knowledge in the enterprise". In Chi '08: Proceeding of the 26th SIGCHI conference on human factors in computing systems. Apr. 5-10, 2008. pp. 1719-1728. Florence, Italy.

Memon, A. et al. "Regression testing of GUIs". In ESEC/FSE-11. Proceedings of the 9th European Software Engineering Conference Held Jointly with 11th ACM SIGSOFT International Symposium on Foundations of Software Engineering. Sep. 1-5, 2003. ACM Press, New York, NY. pp. 118-127.

\* cited by examiner

TABLE 2

| Element | HTML-Tag | Properties |
|---|---|---|
| Button | <input type = "button"> | label |
| Checkbox | <input type = "checkbox"> | label, value, state |
| Radiobutton | <input type = "radio"> | label, value |
| ... | ... | ... |
| Textbox | <input type = "text"> | label, value |

FIG. 7

TABLE 4

| Web Page | ElementId | TestScript | Line | matchedValue |
|---|---|---|---|---|
| Sample1.html | tbox_1 | Login.clr | 1 | "Login:" |
| Sample1.html | tbox_2 | Login.clr | 2 | "Password:" |
| Sample1.html | button_1 | Login.clr | 3 | "Login" |
| Sample1.html | button_2 | Login.clr | 4 | "Cancel" |

FIG. 9

TABLE 1

| ClearScript Statement | Description |
|---|---|
| click the 'Submit' button | Click Action |
| enter '95120' into the 'Zip Code:' textbox | Text Entry Action |
| ... | ... |
| verify there is a 'Cancel' button | Verification Point |

FIG. 6

TABLE 3

| Element | Parent |
|---|---|
| content-pane | container |
| ... | ... |
| tab | tab container |

FIG. 8

AUTOMATIC GENERATION OF USER INTERFACES

CROSS-REFERENCE TO RELATED APPLICATIONS

This application is related to the inventors' application "INTERACTIVE SEMI-AUTOMATIC TEST CASE MAINTENANCE", Ser. No. 13/149,438 which was filed on the same day as the present application and commonly assigned herewith to International Business Machines Corporation. This related application is incorporated herein by reference in its entirety.

BACKGROUND

The present invention generally relates to interface development, and more particularly relates to generating user interfaces from test cases.

The World Wide Web has become the dominant digital medium for information and people are increasingly using it for daily activities. As a result, demand for web content and development of websites is significantly increasing. At the same time, the nature of web development is changing rapidly. Web development is no longer performed only by professional development teams, but also by amateur developers with less technical skills. However, most conventional web development tools have evolved at a much slower pace. As a result, modern web developers face many challenges which are not addressed by existing web development tools.

BRIEF SUMMARY

Embodiments of the invention relate automatically generating and positioning user interface elements. In one embodiment, a method is disclosed. The method comprises receiving at least one test script associated with a user interface as an input. The test script comprises a set of test instructions. Each test instruction in the set of test instructions is parsed. A set of user interface elements referenced by each test instruction is identified in response to the parsing. A determination is made as to whether the user interface comprises the set of user interface elements. At least one user interface element in the set of user interface elements is generated in response to the user interface failing to comprise the at least one user interface element.

In another embodiment, a system is disclosed. The system comprises memory, a processor that is communicatively coupled to the memory. A development and testing environment is communicatively coupled to the memory and the processor. The development and testing environment is configured to receive at least one test script associated with a user interface as an input. The test script comprises a set of test instructions. Each test instruction in the set of test instructions is parsed. A set of user interface elements referenced by each test instruction is identified in response to the parsing. A determination is made as to whether the user interface comprises the set of user interface elements. At least one user interface element in the set of user interface elements is generated in response to the user interface failing to comprise the at least one user interface element.

In yet another embodiment a computer program product for managing user interface elements is disclosed. The computer program product comprises a computer readable storage medium having computer readable program code embodied therewith. The computer readable program code comprises computer readable program code configured to receive at least one test script associated with a user interface as an input. The test script comprises a set of test instructions. Each test instruction in the set of test instructions is parsed. A set of user interface elements referenced by each test instruction is identified in response to the parsing. A determination is made as to whether the user interface comprises the set of user interface elements. At least one user interface element in the set of user interface elements is generated in response to the user interface failing to comprise the at least one user interface element.

BRIEF DESCRIPTION OF THE SEVERAL VIEWS OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which:

FIG. 6 illustrates various examples of scripting language statements according to one embodiment of the present invention;

FIGS. 7-8 illustrate various examples of meta-data file information according to one embodiment of the present invention;

FIG. 9 illustrates one example of the content of a link database after a link is created between a page and a test script according to one embodiment of the present invention

DETAILED DESCRIPTION

Operating Environment

Figure 1:
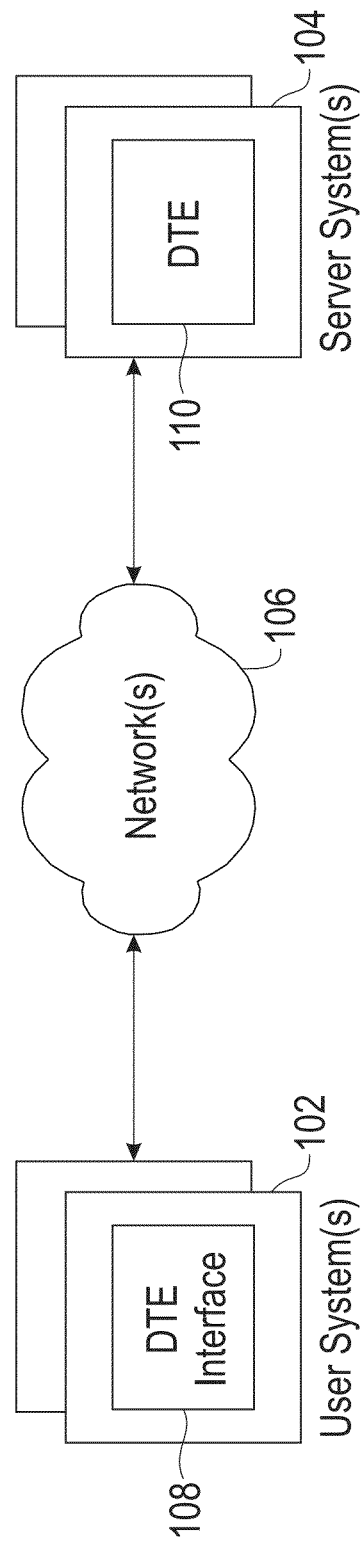
FIG. 1 is a block diagram illustrating one example of an operating environment comprising user interface development and testing environment according to one embodiment of the present invention.

FIG. 1 shows one example of an operating environment 100 applicable to various embodiments of the present invention. The operating environment 100, in one embodiment, comprises one or more user systems 102 communicatively coupled to one or more server systems 104 via a network(s) 106. The user system(s) 102, in one embodiment, is a personal computer, notebook computer, workstation, PDA, cellular phone capable of browsing the Internet, and the like. The network(s) 106, according to one embodiment, comprises a LAN, WAN, World Wide Web, wireless network, or the like.

The user system 102, in one embodiment, comprises a user interface 108, such as a web browser, a mashup, an application, or the like, for interacting with a development and testing environment (WDTE) 110 residing at the server(s) 106. The user interface 108 is referred to from hereon in as the "WDTE interface" 102. The WDTE 110, in one embodiment, is a user interface based environment that does not require installation on the user system 102 and allows users to collaboratively develop and store user interfaces (UIs) such as, but not limited to web pages, on a central server 106. The WDTE 110 integrates development and testing in the same environment and, thus, bridges the gap between development and testing.

Even further, as will be shown in greater detail below, the WDTE 110 automatically generates user interface elements from test cases written in imperative natural language statements. The WDTE 110 parses each line of the test case, identifies a referenced object type(s) and its properties from the parsed line, and adds source code in the source file of the user interface to generate such element. In addition, the WDTE 110 can also infer the hierarchical structure of the elements in the user interface from the test cases and place them on the user interface using that structure. The WDTE 110 also provides a semi-automatic technique for test case maintenance by linking test cases with an application under test. The WDTE 110 maintains test cases using such link and user feed-back. The WDTE 110 takes user input both in link creation and conflict resolution.

Development and Testing Environment

The following is a more detailed discussion on the WDTE 110. In one embodiment, the WDTE 110 represents a test using a scripting language configured for web automation and testing. The WDTE 110 uses a flexible and simple imperative natural language syntax to specify the actions to be performed in a web browser as well as conditions for verification points. Table 1, shown in FIG. 6, shows a few examples of scripting language statements and their description.

The WDTE 110 also lowers the barrier of transforming requirements to code by generating basic elements of a user interface (e.g., buttons, text boxes, checkboxes, comboboxes, and other form elements) as well as advanced JavaScript widgets from imperative natural language requirements represented in a scripting language. Additional programming, CSS styling, and drag-and-drop functionality can style the user interface to completion. The WDTE 110 also improves test case maintenance as a result of changes in user interface by providing a semi-automatic test case maintenance solution that links test cases with user interfaces. Once linked, changes to the user interface or test cases are reflected in the other.

One advantage of the WDTE 110 is that it is centered around a common knowledge artifact (i.e., a scripting language) that is simple to learn and easy to understand. WDTE 110 uses a scripting language for specification, development, and testing, which can increase easy transfer of knowledge among product managers, designers, developers, and testers as well as enhance communication in different phases of website development. Requirements owners can generate requirements alongside website design and test cases. Website developers can perform test-driven development and easily execute preliminary testing. Website testers can quickly develop and execute detailed testing. The WDTE 110 provides a development environment that can streamline the development process and accelerates time to value through an easier and more collaborative solution that is suited for all-levels of skilled and non-skilled developers, making the development easier, faster, and less costly.

The WDTE 110, in one embodiment, is built on top of a web based integrated development environment (IDE). This IDE supports development of web applications using markup languages (e.g., hypertext markup language (HTML), JavaScript, and open source JavaScript such as Dojo. The IDE has support for visual authoring of web sites and editing of code. In addition, the IDE also supports features that have become commonplace in development IDEs, such as multiple development perspectives, web page previews, and design views. The WDTE 110 adds to the functionality of this IDE, providing the test case editing, testing, test maintenance, and code generation features discussed in greater detail below.

Another advantage of the WDTE 110 is that it allows for "coding in the cloud", and hence collaboration. In this embodiment, the WDTE 110 stores source code and workspace information in the cloud. This allows developers around the world working on the same project to check out not only the same code, but also the same configuration settings and environment. Another inherited benefit is the extreme portability of WDTE 110 projects. Since they can be accessed from any web browser, users can work alone or with others in nearly any environment without the need for installation or specific hardware. In one embodiment, each member of the team uses the same authentication (e.g., a team username and a password) so that they share the same team workspace within the central repository 502.

Figure 2:
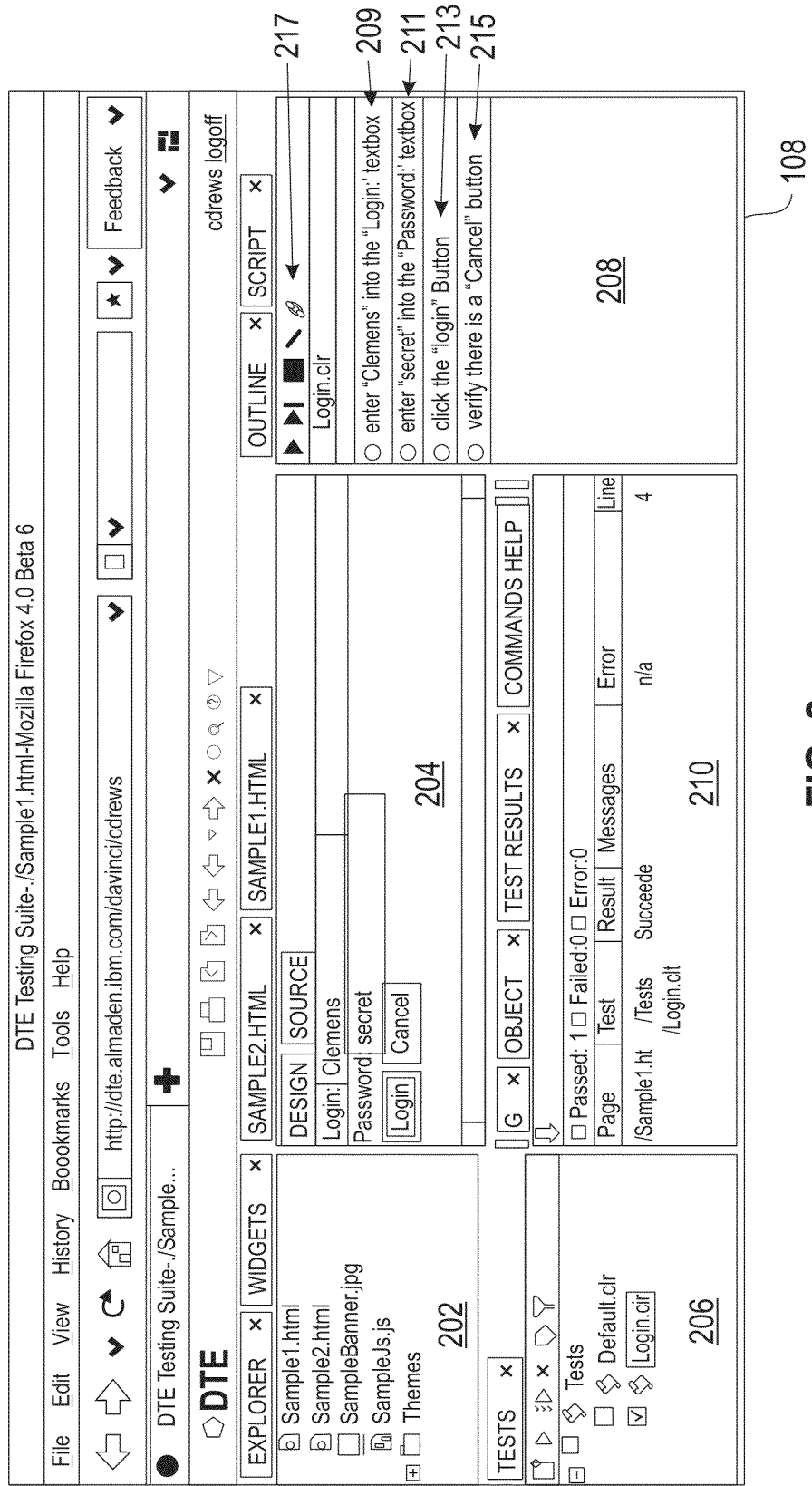
FIG. 2 illustrates one example of the user interface development and testing environment of FIG. 1 being presented to a user according to one embodiment of the present invention.
Figure 3:
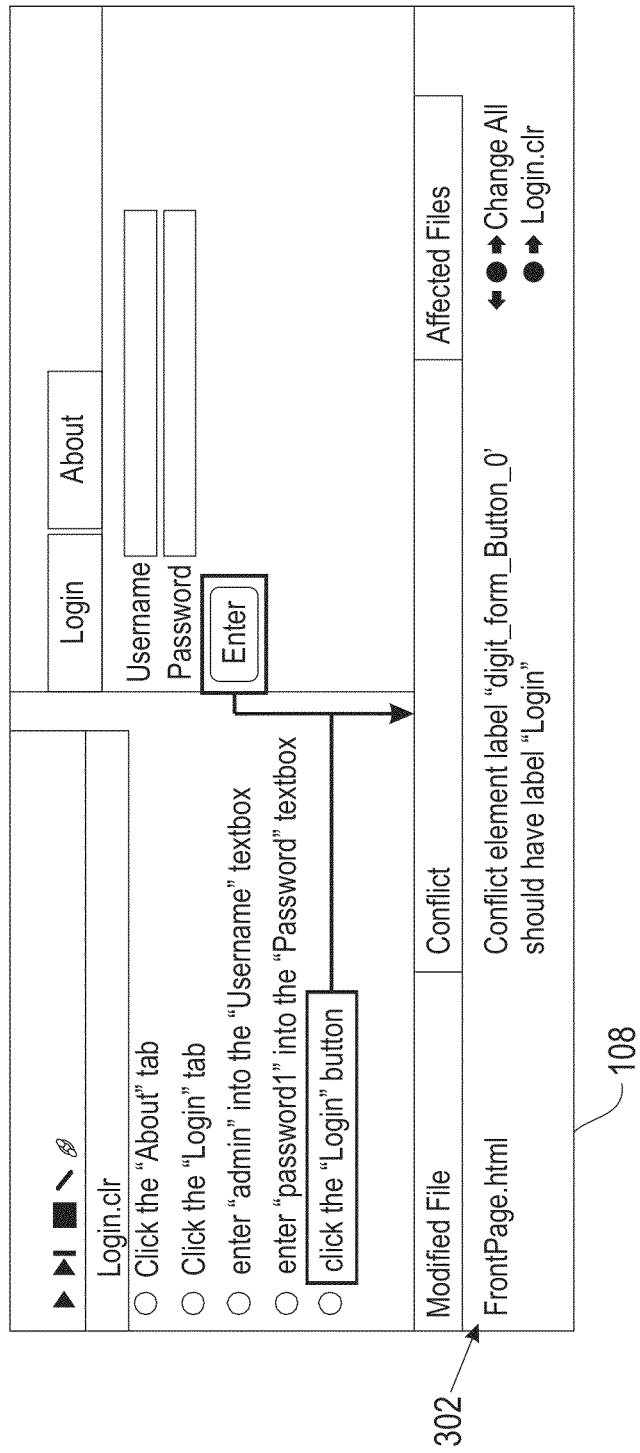
FIG. 3 illustrates one example of a conflict view of the user interface development and testing environment of FIG. 1 according to one embodiment of the present invention.

FIGS. 2-3 shows various examples of the WDTE as presented to the user via the WDTE interface 108. As can be seen from FIG. 2, the WDTE interface 108 presents various components of the WDTE 110 to the user. For example, FIG. 2 shows a file explorer view 202, an editor 204, a test explorer view 206, a test view 208, a results view 210, and a conflict view 302 (FIG. 3) being presented to the user. The file explorer view 202 allows users to view source files of user interfaces and open them for editing and testing in the editor 204. The test explorer 206 view allows users to select tests to run and open individual tests for editing. Users can also create a new test or delete an existing test from this view.

Figure 4:
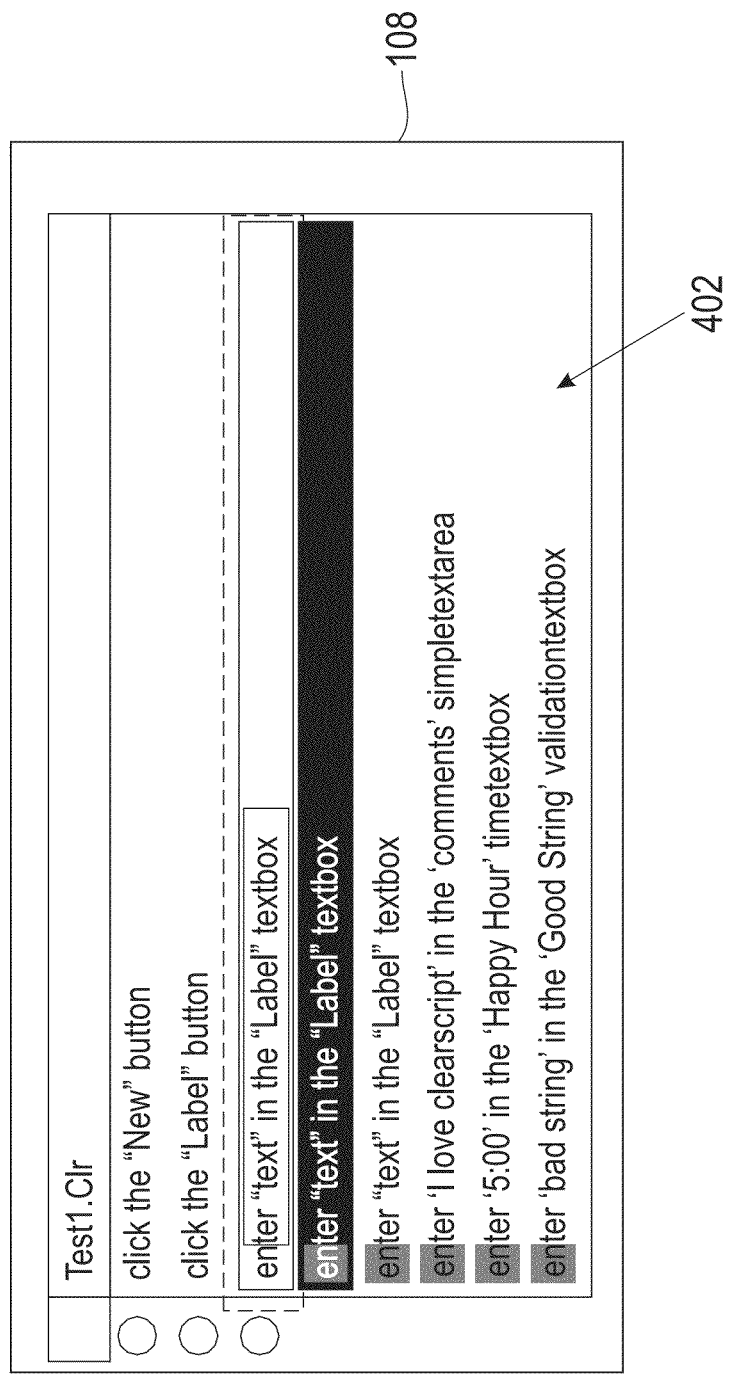
FIG. 4 illustrates one example of a user being suggested syntax for writing a test script according to one embodiment of the present invention.

The test view 208 displays the currently opened test script. For example, in FIG. 2 the test script has four test instructions 209, 211, 213, 215 (also referred to test lines or test steps). Each test instruction is represented in a scripting language. Users can run the entire test or each individual step of the test sequentially. In addition, the users can also modify the test script or write a test script from scratch. To help users write test scripts in a scripting language, the WDTE 110 also displays example scripting language instructions as users start writing a test step. For example, if user starts typing "enter", the WDTE 110 shows the possible scripting language syntax 402 that starts with "enter", as illustrated in FIG. 4. Additional buttons 217 also allow the user to generate user interfaces elements from a test script, and link a test script with a user interfaces for test case maintenance.

The results view 210 displays the results (Success or Failure) of the previous test run. In case of a failure, the results view 210 also displays the reason of the failure. Users can interact with this view by, for example, clicking on a failed test takes the user to the instruction in the script that caused the test to fail. The conflict view 302, shown in FIG. 3, shows the conflicts between user interfaces elements and test case steps when there is a change in either a linked user interfaces or test case. Users can resolve conflicts from this view and, thus, can maintain test cases.

Figure 5:
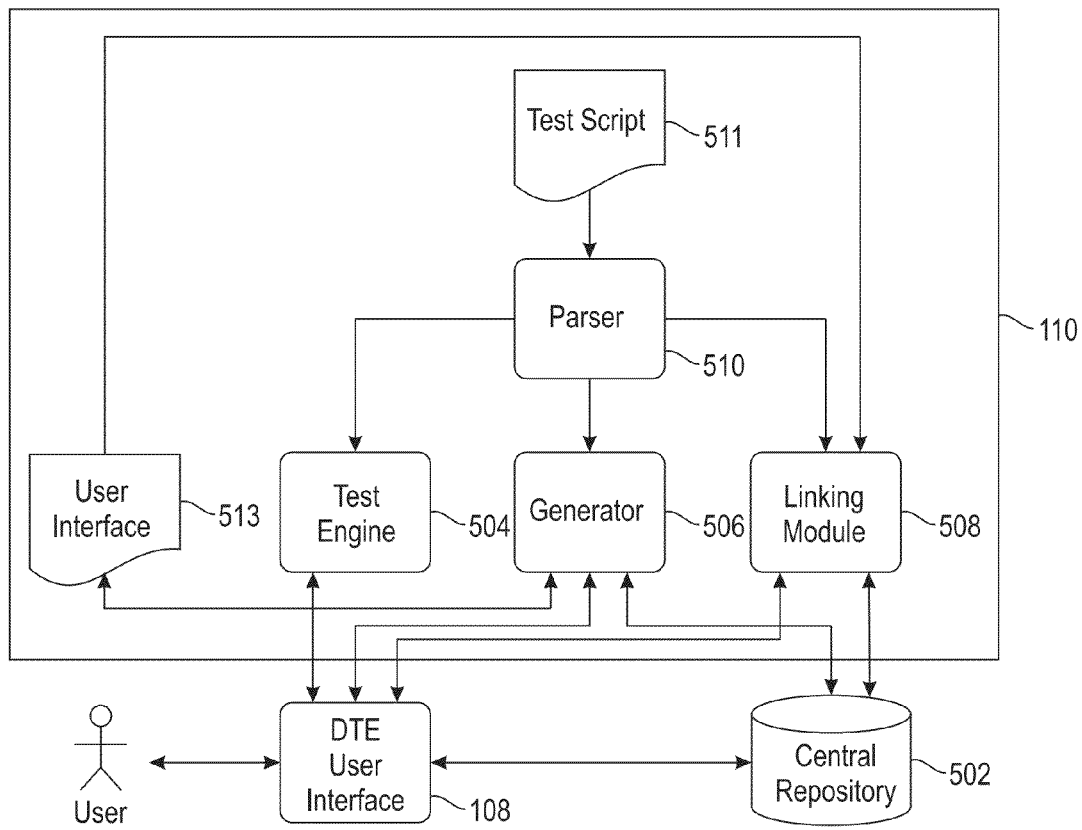
FIG. 5 illustrates a more detailed view of an architecture for the user interface development and testing environment of FIG. 1 according to one embodiment of the present invention.

FIG. 5 shows a more detailed view of the WDTE 110 architecture according to one embodiment of the present invention. In particular, FIG. 5 shows that the WDTE 110 is coupled to the WDTE interface 108 and a central repository 502. The WDTE 110 comprises a scripting language test engine 504, a generator 506, a linking module 508, and a scripting language parser 510. The WDTE interface 108 reads and writes to the server-side file system, which is shown in FIG. 2 as the central repository 502. The central repository 502 stores source files for user interfaces, test scripts, and several other files containing meta-data and mappings. FIGS. 7-9 show examples of such meta-data and mappings. FIG. 9 further shows a mapping that is created after a test is linked with a user interface. In one embodiment, users register with the WDTE 110 and are verified via one or more authentication mechanisms. This allows the WDTE 110 to set up a workspace for that user in the repository 502.

The WDTE interface 108 interprets and displays markup files such as, but not limited to, HTML files (which can include JavaScript) and allows the user to edit and interact with user interfaces such as, but not limited to, web pages. The WDTE interface 108 also allows users to create, update, and delete operations on test cases. Users can also invoke other WDTE 110 features such as generating user interface elements from test cases and linking test cases with user interfaces for test case maintenance.

The scripting language parser 510 receives and parses a test script 511. The scripting language parser 510 then outputs a parsed object for each line of the script 511. Each such parsed object comprises the type of action, type of the object, and optionally an object label and a value. For example, the instruction "click the 'log in' button" is parsed into the following information: {Action Type: click, Object Type: button, Object Label: "log in"}.

The scripting language test engine 504 takes such parsed objects, and analyzes the Document Object Model (DOM) of the user interface 513 to find the desired element. To find a match, the scripting language test engine 504 compares the object type and object label of the parsed object with those of the elements from the user interface 513. When a successful match is identified the scripting language test engine 504 executes the instruction (e.g., the scripting language test engine 504 clicks on a button or enters text). However, if a successful match is not identified, the instruction is not executed and the test fails. The result of the test is a "Success" if all such instructions are successful; otherwise the result is a "Failure". After a test run, the reason for each failure (e.g., parsing error, could not find the "foo" button) is also displayed in the results view 210.

The generator 506 takes a test script 511 as input, and generates user interface elements referenced from the instructions in that test script 511. Users trigger this component by selecting an associated toolbar option from the WDTE interface 108. The generator 506 takes the current test script 511 and the user interface 513 opened in the WDTE interface 108 as input and generates the elements on the user interface 513. To generate a specific user interface element, the WDTE 110, in on embodiment, uses standard HTML tags, as well as basic properties and rules for generating those properties of that element stored in the meta-data file (built a priori) in the repository 502. Table 2 in FIG. 7 shows one such example.

If a user interface is not currently opened, the generator 506 creates a new user interface. The generator 506 invokes the scripting language parser 510 to parse the test script 511, and identifies the action name, object type, object label, and value from each of the parsed instructions, i.e. steps of the script. If the element referenced from an instruction already exists on the user interface 513, the generator 506 does not generate it; otherwise the generator 506 generates that element on the user interface. In addition, the generator 506 also infers the hierarchical position of the generated elements from the test script and places them according to that structure.

The linking module 508 allows a user to link a user interface to a test case. When a link is established between a test case and the user interface, a mapping from each test line to the corresponding referenced element in the user interface 513 is generated and stored in a link database in the repository 502. For example, Table 4 in FIG. 9 shows one such mapping. When linked sources (i.e. a test case or the user interface) are modified test failures are automatically identified, added to a conflict database in the repository 502, and presented to the user using through the WDTE interface 108, as shown in the conflict view 302 of FIG. 3. This allows the user to easily batch modify files for compliance and, thus, maintain test cases.

Automatic Generation and Positioning of User Interface Elements

As discussed above, the WDTE 110 automatically generates and position user interface elements (e.g., buttons, textboxes, etc.) from test scripts. The WDTE 110 takes one or more test scripts 511 as input, and generates the user interface elements referenced by the test instructions in those scripts 511. Each line of the test script 511 is parsed to determine the object type (e.g. a button), object property (e.g. the label "foo"), etc. For each such parsed line, the WDTE 110 tries to find the referenced element in the user interface 513. If the element is found, the WDTE 110 does not generate the element. However, the WDTE 110 temporally stores a reference to this element to allow subsequent elements that are associated with this element to be generated with the correct position in the user interface 513. If the element is not found in the user interface 513, the WDTE 110 creates the element by adding source code to the source file of the user interface 513 for creating that element. To generate such source code, the WDTE 110 interacts with the meta-data file stored in the repository 502. Table 2 shown in FIG. 7 gives examples of such meta-data files. For example, to create an HTML button, the WDTE 110 uses the following code: <input type="button">.

For each user interface element, the meta-data file also stores a set of properties and rules to associate each property with the object property from parsed test instruction. Meta-data values are assigned to the generated element/widget when the parser 510 parses such a meta-data value(s) from the test instruction. For example, if the parser 510 identifies that the label of the button is "My Button", then the WDTE 110 associates the label property of the generated button with "my button". In one example, the generated source is as follows:

<label>My Button</label><input type="button"/>. In another example, generating a checkbox from the scripting language instruction "turn on the "color" checkbox" adds the following source: <label>color</label><input type="checkbox" value="color" checked>. Here, the rules to associate the value property of the generated checkbox with the parsed object property are maintained in the repository 502.

The WDTE 110 creates three different categories of user interface elements: simple elements, compound elements, and elements with sub-elements. Simple elements are regular elements that can include all of their referenced properties. For example, an element "click the 'foo' button" creates a button with label "foo". Compound elements include specific elements that require additional elements to be created to store a meta-data value referenced in a test instruction. A textbox element does not have an inherent label property, but a label may exist in the object property parsed from the test instruction. For example, the test line "enters 'foo' into the 'User Name' textbox" creates a text element with the content "User Name" and inserts this content before the generated textbox element. Here the purpose of the text element is to visually display the label property of the adjacent textbox.

Figure 10:
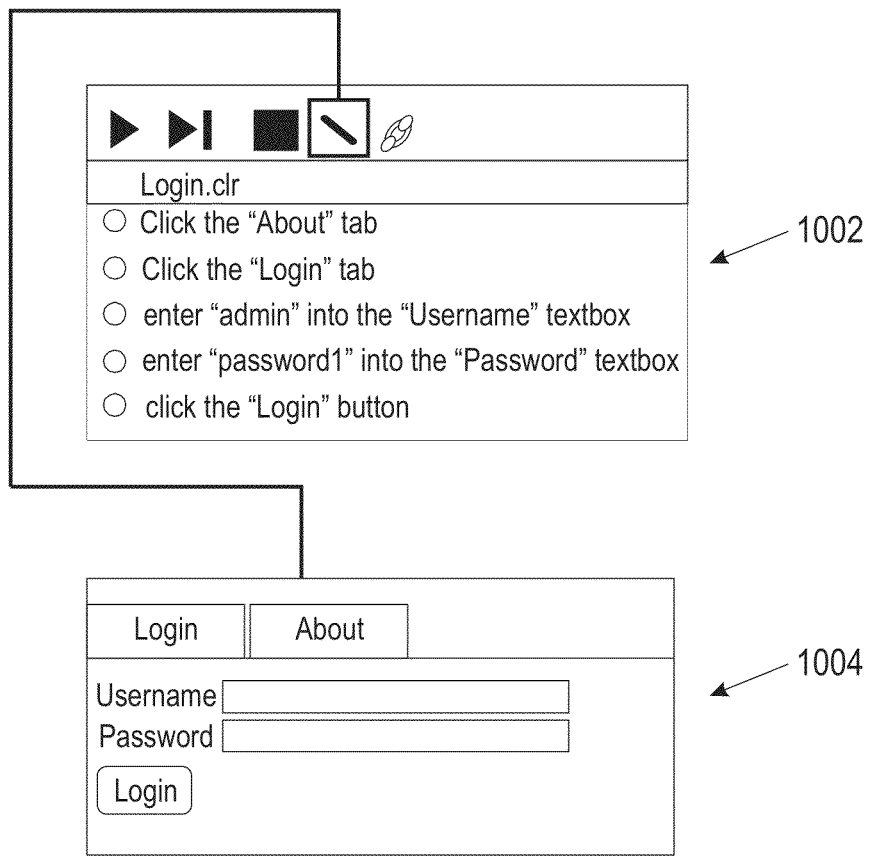
FIG. 10 illustrates one example of generating user interface elements from a test case according to one embodiment of the present invention.

Elements with sub-elements are advanced elements that are composed of several sub elements, e.g. Accordion and Tab containers, or a drop-down menu. These elements are generated using references to existing elements on the user interface. For example a listbox can have multiple items thereon. Once the WDTE 110 generates the first item on the list, the rest of the items do not generate the listbox again. Instead, they add new items to the already generated listbox. For example, performing this process for the test script 1002 shown in the top portion of FIG. 10 generates the user interface elements 1004 shown in the bottom portion of FIG. 10.

The user interface elements generated by the WDTE 110 are separated into two groups (or positioning types): layout elements and non-layout elements. Layout elements do not interact with input or outputs associated with the user, but are instead used to arrange other elements in the user interface. The Accordion Container, Layout Container, and PageTab are examples of such elements. Non-layout elements are composed of elements that are not used to arrange other elements, but are used for interacting with users. For example, buttons, textboxes, lists and number spinners are examples Non-Layout elements.

The first element in a test case is positioned on the user interface irrespective of other elements since no other elements have been generated at this point. From the subsequent generated element, the WDTE 110 uses four basic cases to identify how to position the element. These cases are: Layout-Layout, Layout-NonLayout, NonLayout-Layout, and Non-Layout-NonLayout. If the previously generated element is a Layout element (e.g. a tab) and the current element is also a Layout element (e.g. a container), then the MDTE 110 looks at the meta-data file in the repository 502, which stores a structural relationship(s) between layout elements. For example, Table 3 in FIG. 8 shows example of one such meta-data file. If there is no such relationship between these two subsequent elements, the MDTE 110 places them independent of one another in the user interface. Otherwise the MDTE 110 follows the relationship specified in the meta-data file to put them in the user interface.

However if the previous element is a Layout element and the current element is a NonLayout element, the current element is placed as a child of the previous element. If the previous element is a NonLayout element and the current element is a Layout element, then all the subsequent NonLayout elements are placed as a child of the current Layout element until another Layout element is detected. If the previous element is a NonLayout element and the current element is also a NonLayout element then there are two cases depending on if the previous NonLayout element has a Layout parent element. If the previous NonLayout element has a Layout parent element, then the current NonLayout element is also placed as a sibling of the previous NonLayout element. Otherwise the current NonLayout element is placed independently of the previous NonLayout element.

Figure 11:
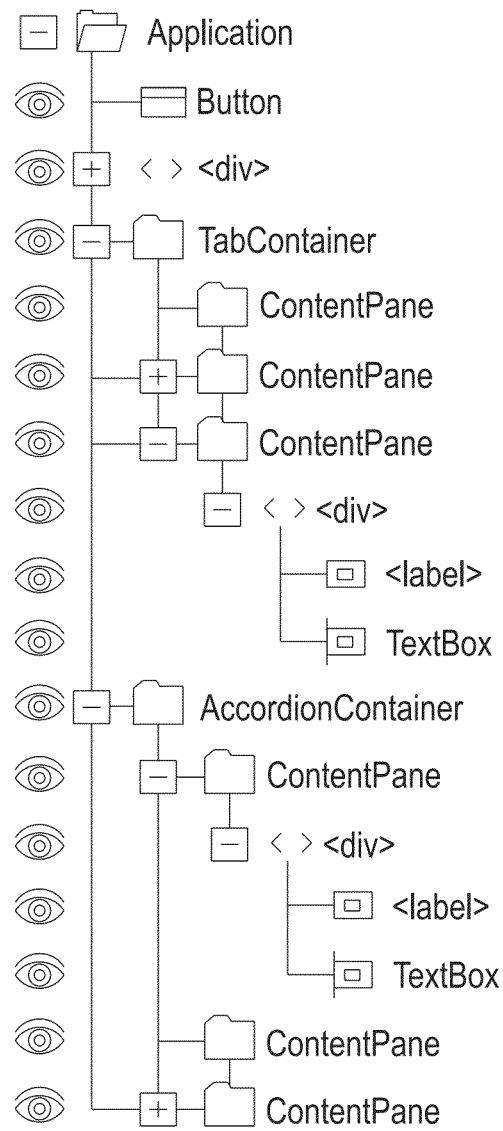
FIG. 11 illustrates one example of an object model tree according to one embodiment of the present invention.

The above approach, in one embodiment, forms an object model tree (e.g. A DOM tree for HTML) representing the user interface from the test case. FIG. 11 shows an object model tree 1102 of a user interface that has been constructed from a test case. In particular, the object model tree 1102 shown in FIG. 11 is associated with advanced elements. Usually, advanced elements are containers inside a list of multiples containers. Based on the fact that these advanced elements are to be part of a group of elements of the same type, the WDTE 110 predicts the position of an advanced element based on the history of other elements already created. If a member of this type of element has already been created, the WDTE 110 joins this new element with the existing container. If not, the WDTE 110 follows the steps above and creates the new element. For example, a Content Pane can be placed inside an Accordion-Container. If there is already an Accordion-Container and a Content Pane created, and the Content-Pane is placed as a child of the Accordion-Container and if the current element is also a Content-Pane, then the current element is placed as a sibling of the other Content-Pane (i.e. as a child of the Accordion-Container).

Figure 12:
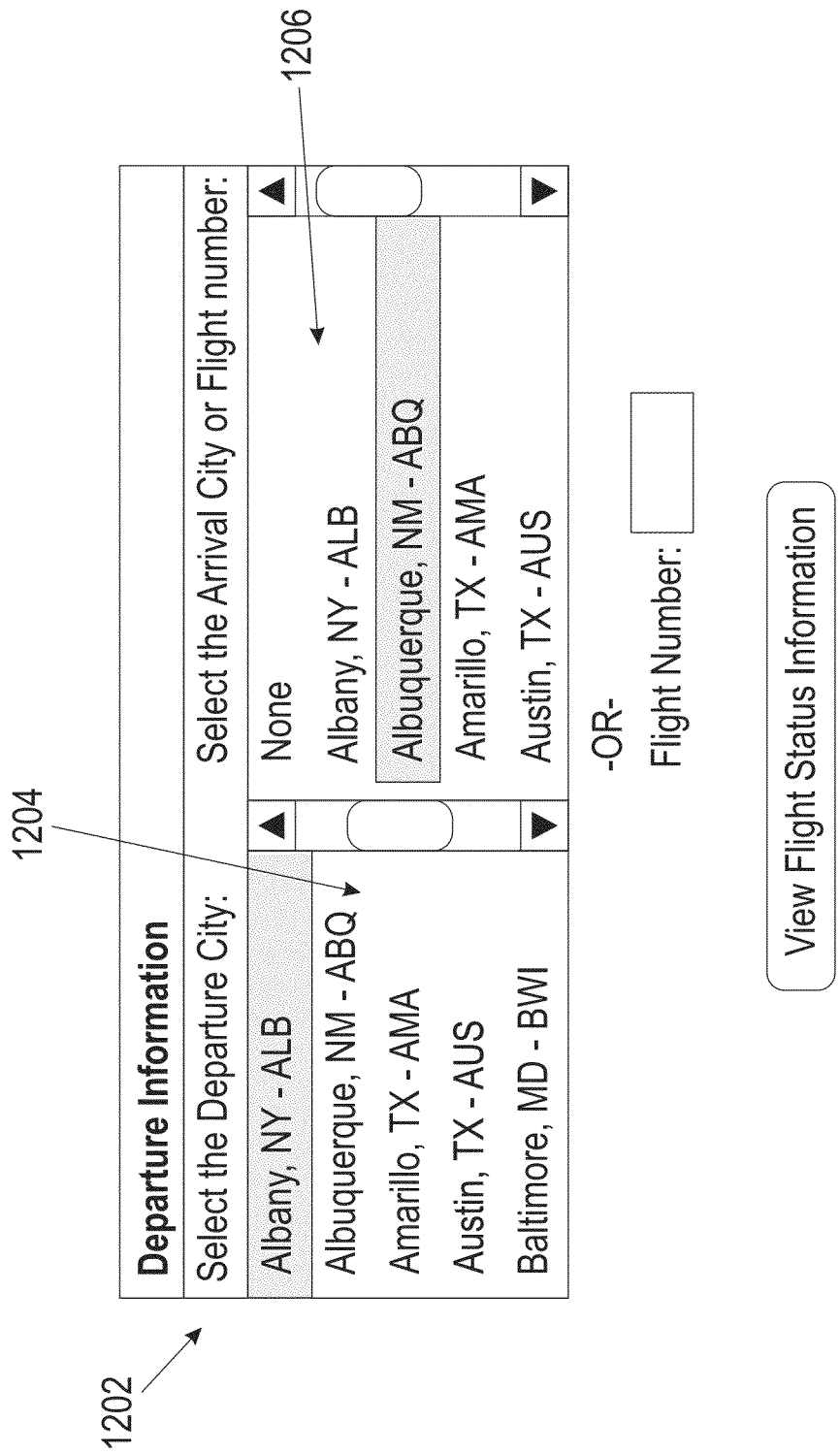
FIG. 12 illustrates one example of compound user interface elements generated from multiple test scripts according to one embodiment of the present invention.

The WDTE 110 can also generate complex user interfaces from multiple sources as well. For example, the WDTE 110 creates temporary anchors between shared elements to generate a combined requirements list in correct order. Since different test cases take different paths through a user interface (e.g. a web page), additional knowledge of the elements on the user interface can be obtained. For example, FIG. 12 shows one example of a flight tracker web page 1202 that includes two select boxes 1204, 1206 listing cities.

One script can include the steps, "Select 'Albany, NY' from the 'Select the Departure City:' selectbox", "Select 'Albuquerque, NM' from the 'the Arrival City or Flight number:' selectbox". Another script can include the steps, "Select 'Austin, TX' from the 'Select the Departure City:' selectbox", "Select 'Amarillo, TX' from the 'Select the Arrival City or Flight number:' selectbox". From these two scripts the WDTE 110 can generate a 'Select the Departure City:' select box that includes two options; 'Albany, NY' and 'Austin, TX'. The WDTE 110 can also generate a 'Select the Arrival City or Flight number:' selectbox that includes two options; 'Albuquerque, NM' and 'Amarillo, TX'. This is much more useful than a select box with only one option. In testing one usually wants to test every path through a user interface. If all of the test cases are written before hand from a requirements document then every option and path through the user interface should be known and can be automatically generated.

Source and Test Case Linking for Automatic Updates

In addition to automatically generating and positioning user interface elements, the WDTE 110 can also provide semi-automatic test case maintenance by creating links between test case instructions, the source code of a user interface, and interactive user feedback to resolve conflict. The WDTE 110 allows interactive link creation between tests and source code and interactive conflict resolution by allowing users to specify links between tests and user interfaces. When such a link is established between a test case and the user interface, a mapping from an element referenced by test instructions and those in the user interface is created by matching each element in the user interface with a corresponding reference in the test script (e.g., matching a property of an element in the user interface with a corresponding property reference in the test script). Such mapping and user feedback is used to maintain test cases when the application under test (AUT) changes. When linked sources are modified, the WDTE 110 automatically identifies test failures and presents these failures to the user. This allows the users to easily batch modify files for compliance. This process streamlines the time consuming process of updating multiple files that depend on one file.

In one embodiment, one or more users create a link between a user interface and a test script via the WDTE interface 108. A user interface can be linked with any number of test scripts and a test script can also be linked with any number of user interfaces. When a link is established between a test script 511 and the user interface 513, the test engine 504 runs the specified test on the specified user interface 513. As the test is run each line of the test is matched to the element that it references and a mapping from each test line to the corresponding matched element is established. For example, creating a link between the test script and the user interface shown in FIG. 2 results in the mapping entries shown in Table 4 (FIG. 9) being created. The mapping information is stored in the link database file in the repository 502.

Figure 13:
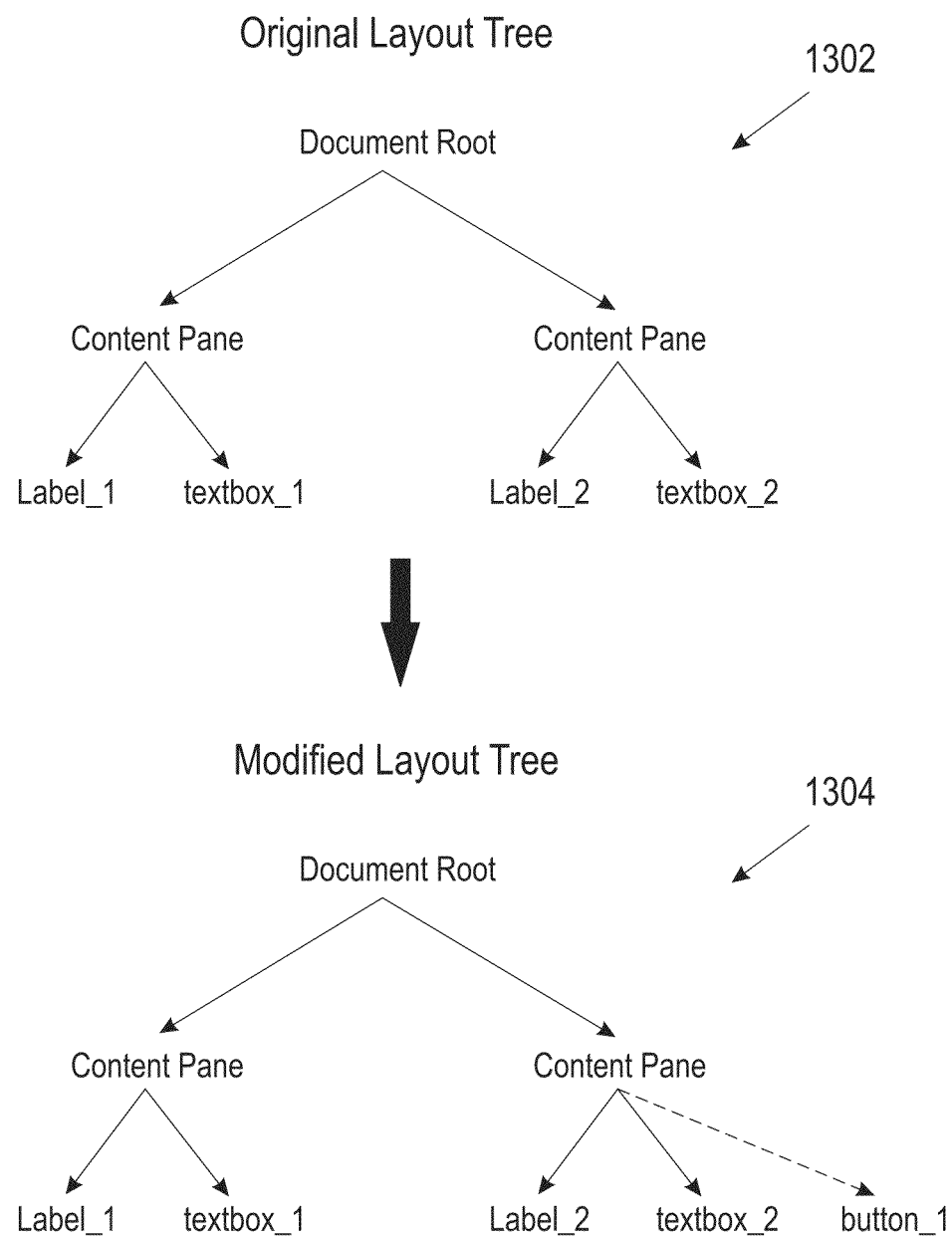
FIG. 13 illustrates one example of an original layout tree and a modified layout tree for detecting changes between a test script and a user interface according to one embodiment of the present invention.

Once a link is established between a user interface 513 and a test script 511, the linking module 508 is notified whenever a change takes place either in the source file of the user interface 513 or in the test script 511. The following changes can occur with respect to the source file of the user interface 513: Element added, Element deleted, and Element updated. The linking module 508 detects an Element added/deleted change by comparing the Layout trees 1302, 1304 of current and previous source files, where a layout Tree of a source file is a rendering of the elements of that source file. FIG. 13 shows one such example of an original layout tree 1302 and a modified layout tree 1304.

An Element updated change can be identified when changes are made to the source file of the user interface, but the layout tree does not change. When an addition of an element is detected by the linking module 508, a line is added to the conflict view 302 stating that the element on the user interface is not tested. For update of an element, all linked test lines are run against the changed file. If a test line fails, the problem is recorded to the conflict database and displayed in the conflict view 302. When the conflict is resolved, the link database is updated with the element that allows the test to pass. For the deletion of an element, all test lines linked to the removed element are added to the conflict database and shown in the conflict view 302. If the change is rolled back by the user, the element is re-added to the page. If the change is accepted by the user, the test lines are deleted.

The following changes can occur in the test script: Test Line Inserted, Test Line Deleted and Test Line Updated. The linking module 508 can detect these changes by comparing the current and previous versions of the script files. When a test line is inserted, the test engine 504 runs a test against the source of all linked user interfaces. A new entry is created in the link database with the line information. If the line fails the conflict is added to the conflict view 302 and the entry in the link database is updated with place holder data. If the line succeeds the link is updated with the element that allowed the test to pass. A deletion of a test line results in an error to be added to the conflict database to remind the user that the element linked to the line is now untested. When a test line is updated, the link database is queried to determine if a conflict has been created. If a conflict is created, it is added to the conflict database and displayed in the conflict view 302. If there was no conflict, the link database is updated to reflect the new contents of the line.

The conflict view 302 shows all the conflicts detected for the current project. For example, FIG. 3 shows an example of a conflict view 302 as a result of a modification of the file FrontPage.html. As a result of renaming a button in this web page, its linked test script fails. Users can modify each of such affected files so that the tests for the web pages now pass. For example in FIG. 3, a user may select "Change All". which updates the test lines of "Login.clr" with modified button label. As a result, the test passes again. This is one example of how users may visualize and resolve conflict as a result of changes in user interfaces or test scripts and, thus, maintain test cases.

Operational Flow Diagrams

Figure 14:
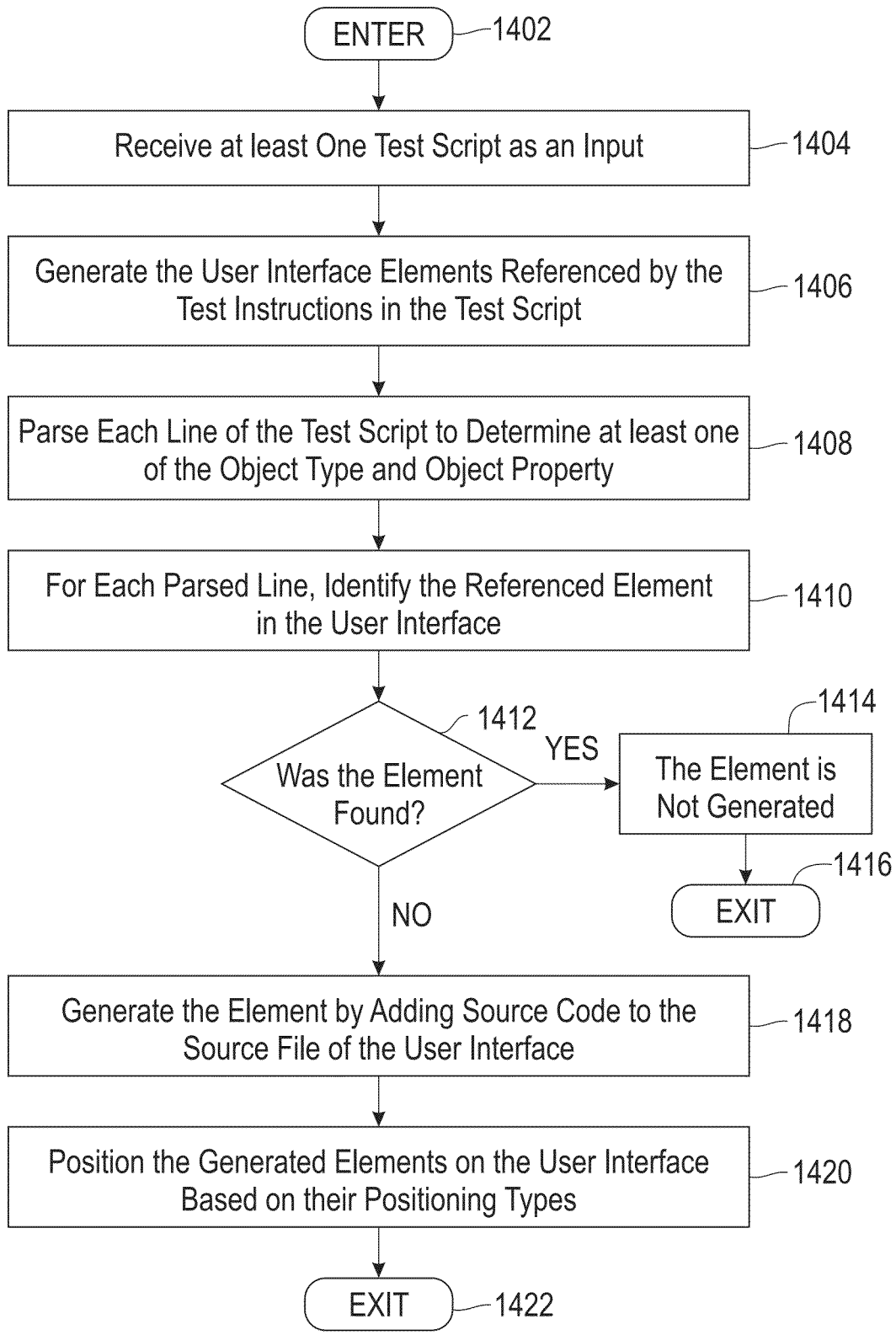
FIG. 14 is an operational flow diagram illustrating one example of a process for automatically generating and positioning user interface elements according to one embodiment of the present invention.
Figure 15:
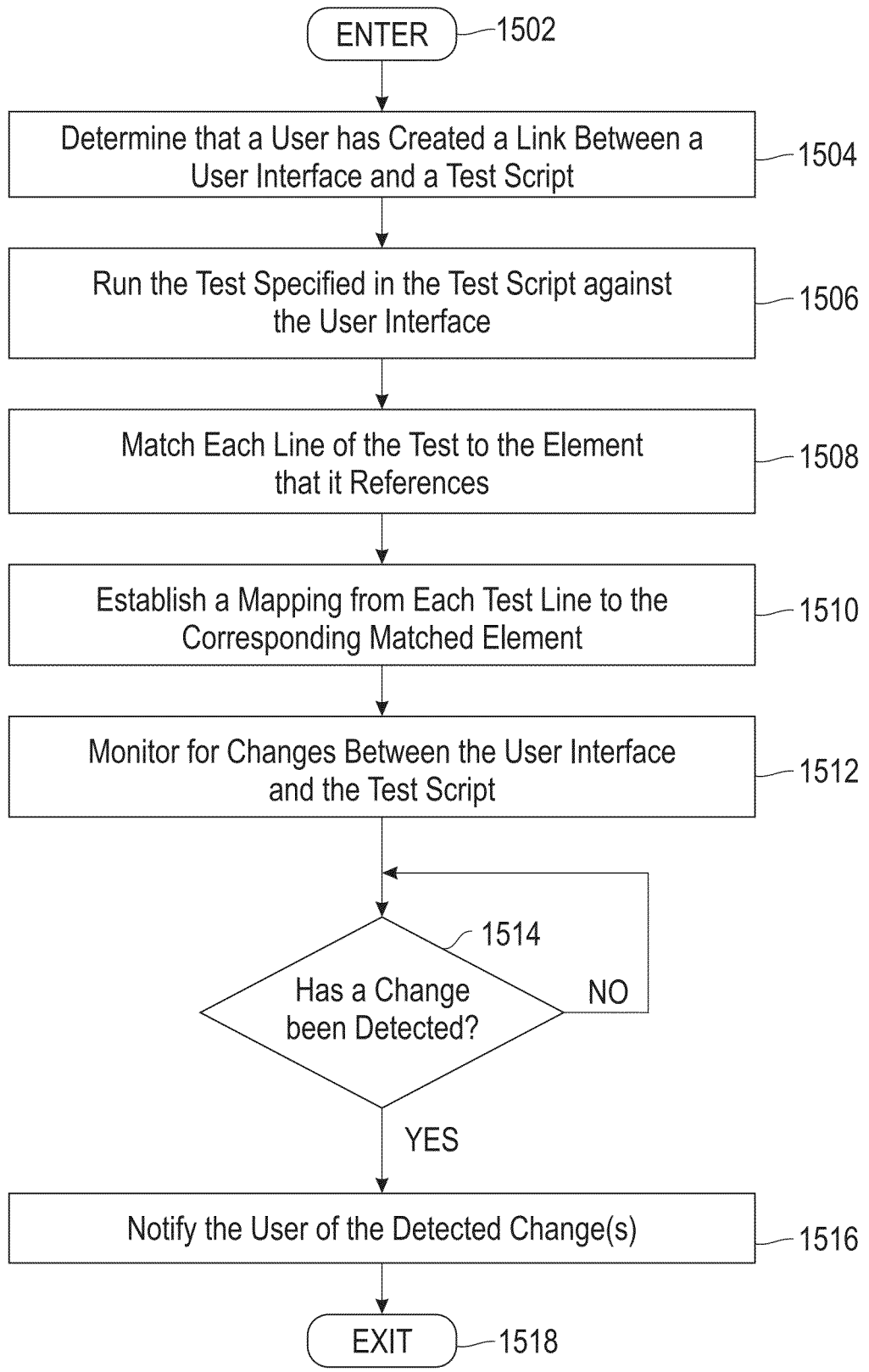
FIG. 15 is an operational flow diagram illustrating one example of a process for source and test case linking for automatic updates according to one embodiment of the present invention.

Referring now to FIGS. 14-15, the flowcharts and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

FIG. 14 is an operational flow diagram illustrating one overview of a process for automatically generating and positioning user interface elements. It should be noted that a more detailed discussion with respect to this process has already been given above with respect to FIGS. 1-12. The operational flow of FIG. 14 starts at step 1402 and flows directly into step 1404. The WDTE 110, at step 1404, receives at least one test script 511 as in input. The WDTE 110, at step 1406, generates the user interface elements referenced by the test instructions in the test script 511. The WDTE 110, at step 1408, parses each line of the test script to determine at least one of the object type and object property referenced therein.

The WDTE 110, at step 1410, identifies, for each parsed line, the referenced element in the user interface 513. The WDTE 110, at step 1412, determines if an element was found. If the result of this determination is positive, the WDTE 110, at step 1414, does not generate the element. If all elements have been found, the control flow then exits at step 1416. However, if the result of the determination at step 1412 is negative, the WDTE 110, at step 1418, generates the element(s) by adding source code to the source file of the user interface. The WDTE 110, at step 1420, then positions the generated element(s) on the user interface 513 based on a positioning type associated with the element. The control flow then exits at step 1422.

FIG. 15 is an operational flow diagram illustrating one overview of a process for source and test cases for automatic updates. It should be noted that a more detailed discussion with respect to this process has already been given above with respect to FIGS. 1-5 and 13. The operational flow of FIG. 15 starts at step 1502 and flows directly into step 1504. The WDTE 110, at step 1504, determines that a user has created a link between a user interface 513 and a test script 511. The WDTE 110, at step 1506, runs the test specified in the test script against the user interface 513. The WDTE 110, at step 1508, matches each line of the test to the user interface element that it references.

The WDTE 110, at step 1510, establishes a mapping from each test line to the corresponding matched user interface element. The WDTE 110, at step 1512, monitors for changes between the user interface 513 and the test script 511. The WDTE 110, at step 1514, determines if a change has been detected. If the result of this determination is negative, the WDTE 110 continues to monitor for changes. However, if the result of this determination is positive, the WDTE 110, at step 1516, notifies the user of the detected change(s). The control flow then exits at step 1518.

Information Processing System

Figure 16:
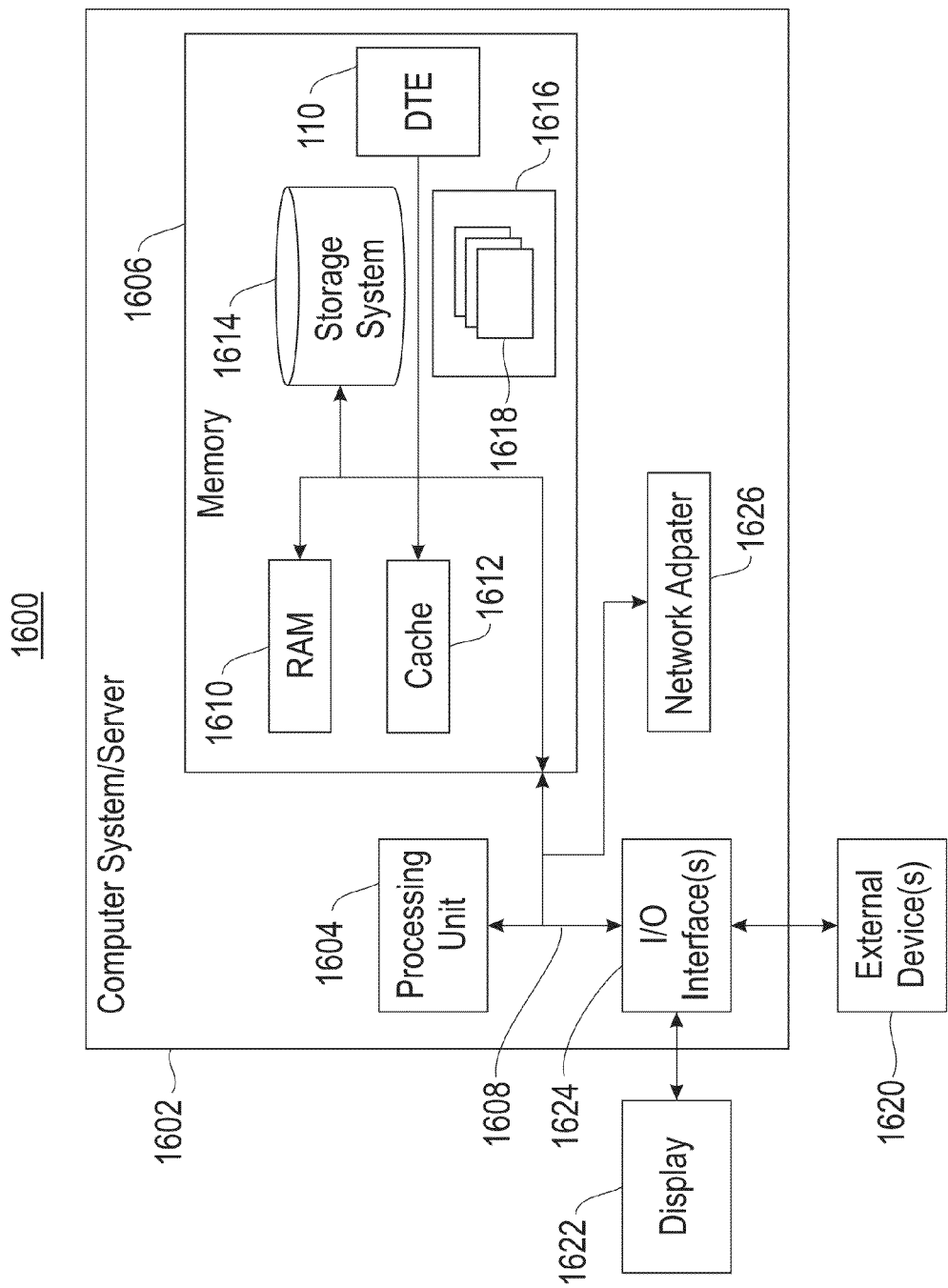
FIG. 16 illustrates one example of a cloud computing node according to one embodiment of the present invention.

Referring now to FIG. 16, a schematic of an example of an information processing system 1600 such as the server system 104 of FIG. 1. In one embodiment, the information processing system 1600 is a cloud computing node. Cloud computing node 1600 is only one example of a suitable cloud computing node and is not intended to suggest any limitation as to the scope of use or functionality of embodiments of the invention described herein. Regardless, cloud computing node 1600 is capable of being implemented and/or performing any of the functionality set forth hereinabove.

In the cloud computing node 1600 there is a computer system/server 1602, which is operational with numerous other general purpose or special purpose computing system environments or configurations. Examples of well-known computing systems, environments, and/or configurations that may be suitable for use with computer system/server 1602 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 1602 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 1602 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 16, computer system/server 1602 in cloud computing node 1600 is shown in the form of a general-purpose computing device. The components of computer system/server 1602 may include, but are not limited to, one or more processors or processing units 1604, a system memory 1606, and a bus 1608 that couples various system components including system memory 1606 to processor 1604.

Bus 1608 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 1602 typically includes a variety of computer system readable media. Such media may be any available media that is accessible by computer system/server 1602, and it includes both volatile and non-volatile media, removable and non-removable media.

System memory 1606, in one embodiment, comprises the WDTE 110 and its components. The WDTE 110 can also be implemented in hardware as well. The system memory 1606 can include computer system readable media in the form of volatile memory, such as random access memory (RAM) 1610 and/or cache memory 1612. Computer system/server 1602 may further include other removable/non-removable, volatile/non-volatile computer system storage media. By way of example only, storage system 1614 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 1608 by one or more data media interfaces. As will be further depicted and described below, memory 1606 may include at least one program product having a set (e.g., at least one) of program modules that are configured to carry out the functions of embodiments of the invention.

Program/utility 1616, having a set (at least one) of program modules 1618, may be stored in memory 1606 by way of example, and not limitation, as well as an operating system, one or more application programs, other program modules, and program data. Each of the operating system, one or more application programs, other program modules, and program data or some combination thereof, may include an implementation of a networking environment. Program modules 1618 generally carry out the functions and/or methodologies of embodiments of the invention as described herein.

Computer system/server 1602 may also communicate with one or more external devices 1620 such as a keyboard, a pointing device, a display 1622, etc.; one or more devices that enable a user to interact with computer system/server 1602; and/or any devices (e.g., network card, modem, etc.) that enable computer system/server 1602 to communicate with one or more other computing devices. Such communication can occur via I/O interfaces 1624. Still yet, computer system/server 1602 can communicate with one or more networks such as a local area network (LAN), a general wide area network (WAN), and/or a public network (e.g., the Internet) via network adapter 1626. As depicted, network adapter 1626 communicates with the other components of computer system/server 1602 via bus 1608. It should be understood that although not shown, other hardware and/or software components could be used in conjunction with computer system/server 1602. Examples, include, but are not limited to: microcode, device drivers, redundant processing units, external disk drive arrays, RAID systems, tape drives, and data archival storage systems, etc.

Cloud Environment

It is understood in advance that although the following is a detailed discussion on cloud computing, implementation of the teachings recited herein are not limited to a cloud computing environment. Rather, various embodiments of the present invention are capable of being implemented in conjunction with any other type of computing environment now known or later developed. For example, various embodiments of the present invention are applicable to any computing environment with a virtualized infrastructure or any other type of computing environment.

For convenience, the Detailed Description includes the following definitions which have been derived from the "Draft NIST Working Definition of Cloud Computing" by Peter Mell and Tim Grance, dated Oct. 7, 2009, which is cited in an IDS filed herewith, and a copy of which is attached thereto. However, it should be noted that cloud computing environments that are applicable to one or more embodiments of the present invention are not required to correspond to the following definitions and characteristics given below or in the "Draft NIST Working Definition of Cloud Computing" publication. It should also be noted that the following definitions, characteristics, and discussions of cloud computing are given as non-limiting examples.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as Follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 17:
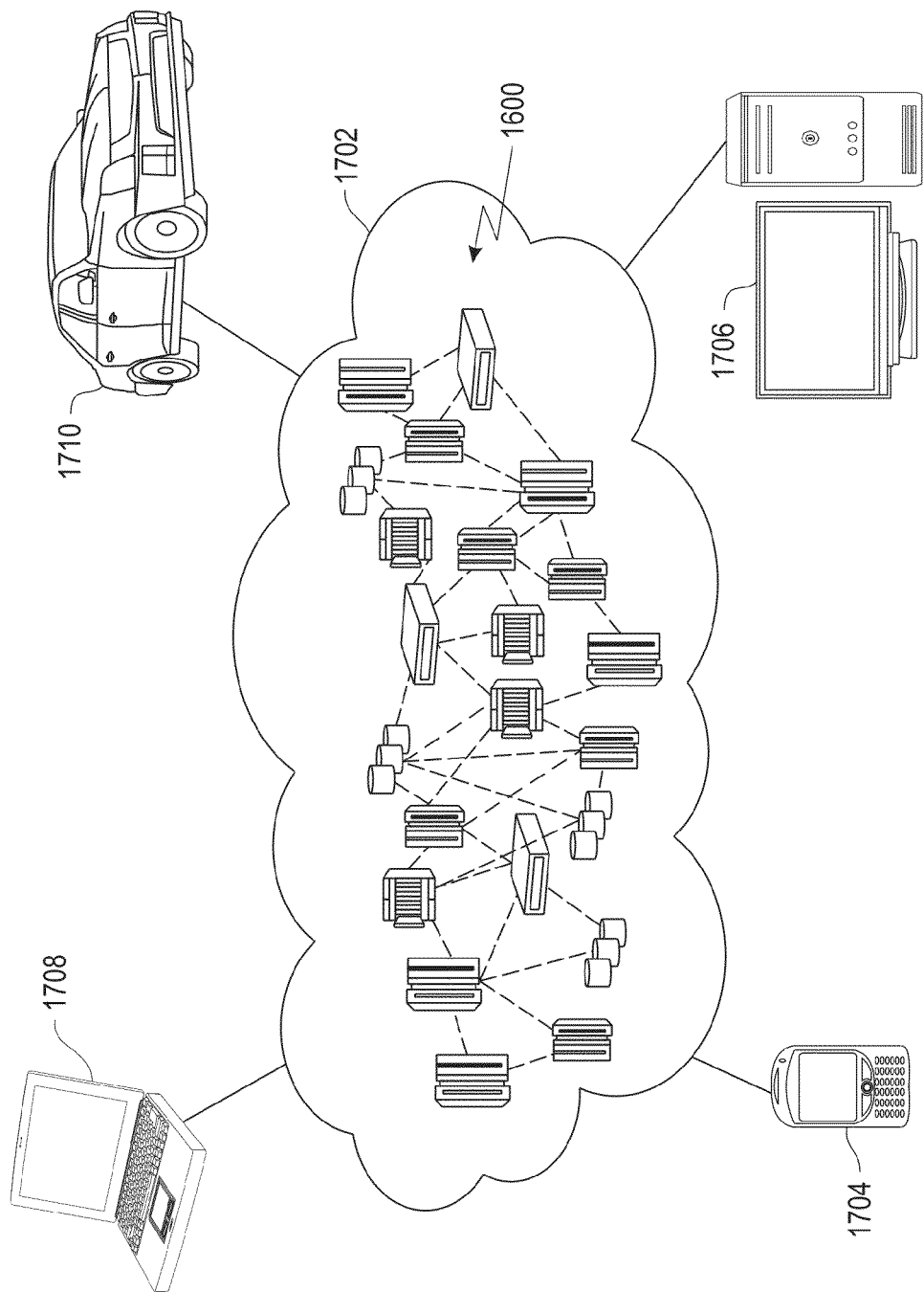
FIG. 17 illustrates one example of a cloud computing environment according to one embodiment of the present invention.

Referring now to FIG. 17, illustrative cloud computing environment 1702 is depicted. As shown, cloud computing environment 1702 comprises one or more cloud computing nodes 1600 with which local computing devices used by cloud consumers, such as, for example, personal digital assistant (PDA) or cellular telephone 1704, desktop computer 1706, laptop computer 1708, and/or automobile computer system 1710 may communicate. Nodes 1704, 1706, 1708, 1710 can communicate with one another. They may be grouped (not shown) physically or virtually, in one or more networks, such as Private, Community, Public, or Hybrid clouds as described hereinabove, or a combination thereof. This allows cloud computing environment 1702 to offer infrastructure, platforms and/or software as services for which a cloud consumer does not need to maintain resources on a local computing device. It is understood that the types of computing devices 1704, 1706, 1708, 1710 shown in FIG. 17 are intended to be illustrative only and that computing nodes 700 and cloud computing environment 1702 can communicate with any type of computerized device over any type of network and/or network addressable connection (e.g., using a web browser).

Figure 18:
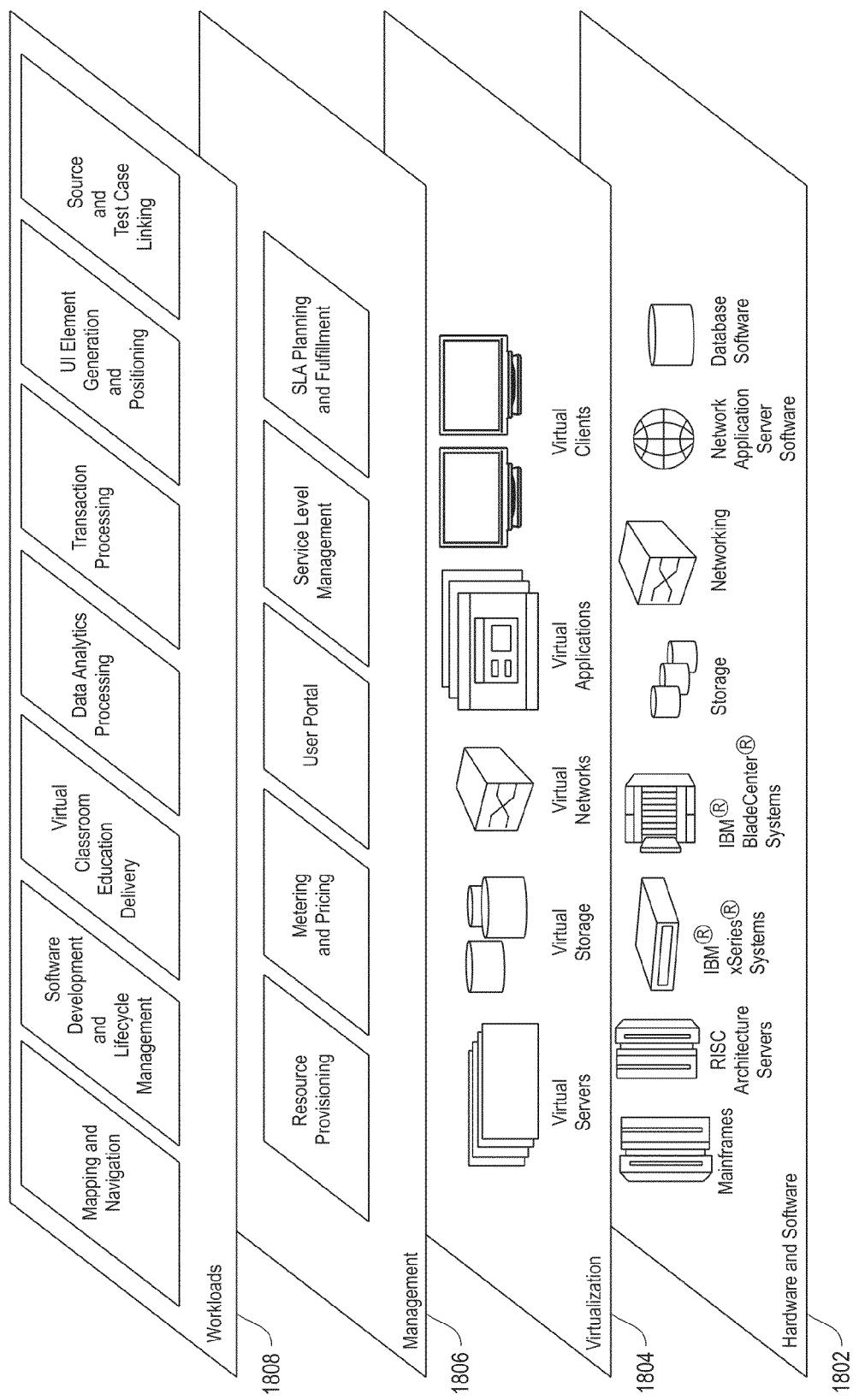
FIG. 18 illustrates abstraction model layers according to one embodiment of the present invention.

Referring now to FIG. 18, a set of functional abstraction layers provided by cloud computing environment 1702 (FIG. 17) is shown. It should be understood in advance that the components, layers, and functions shown in FIG. 18 are intended to be illustrative only and embodiments of the invention are not limited thereto. As depicted, the following layers and corresponding functions are provided:

Hardware and software layer 1802 includes hardware and software components. Examples of hardware components include mainframes, in one example IBM® System z® systems; RISC (Reduced Instruction Set Computer) architecture based servers, in one example IBM System p® systems; IBM System x® systems; IBM BladeCenter® systems; storage devices; networks and networking components. Examples of software components include network application server software, in one example IBM WebSphere® application server software; and database software, in one example IBM DB2® database software. (IBM, zSeries, pSeries, xSeries, BladeCenter, WebSphere, and DB2 are trademarks of International Business Machines Corporation registered in many jurisdictions worldwide)

Virtualization layer 1804 provides an abstraction layer from which the following examples of virtual entities may be provided: virtual servers; virtual storage; virtual networks, including virtual private networks; virtual applications and operating systems; and virtual clients.

In one example, management layer 1806 may provide the functions described below. Resource provisioning provides dynamic procurement of computing resources and other resources that are utilized to perform tasks within the cloud computing environment. Metering and Pricing provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal provides access to the cloud computing environment for consumers and system administrators. Service level management provides cloud computing resource allocation and management such that required service levels are met. Service Level Agreement (SLA) planning and fulfillment provide pre-arrangement for, and procurement of, cloud computing resources for which a future requirement is anticipated in accordance with an SLA.

Workloads layer 1808 provides examples of functionality for which the cloud computing environment may be utilized. Examples of workloads and functions which may be provided from this layer include: mapping and navigation; software development and lifecycle management; virtual classroom education delivery; data analytics processing; transaction processing; automatic generation and positioning of user interface elements, and source and test case linking for automatic updates, as discussed above.

Non-Limiting Examples

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, comprising:
receiving at least one test script associated with a user interface as an input, wherein the test script comprises a set of test instructions configured to test the user interface;
parsing each test instruction in the set of test instructions;
identifying, based on the parsing, a set of user interface elements associated with the user interface referenced by each test instruction;
determining whether the user interface comprises the set of user interface elements based on a document object model associated with the user interface;
generating, within the user interface, at least one user interface element in the set of user interface elements based on the user interface failing to comprise the at least one user interface element, the generating avoiding a failure of the at least one test script;
automatically positioning the user interface element that has been generated on the user interface wherein the user interface is automatically positioned on the user interface based on the user interface element being one of a first type that is used to arrange other user interface elements in the user interface and a second type that is used for interacting with users; and
executing the set of text instructions on the set of user interface elements including the at least one user interface element that has been generated.

2. The method of claim 1, wherein generating the user interface element further comprises:
adding a set of source code for generating the user interface element to a source file of the user interface.

3. The method of claim of claim 1, wherein generating the user interface element further comprises:
updating at least one meta-data file associated with the user interface to associate an object type with the user interface element, wherein the object type is identified from the set of test instructions.

4. The method of claim 1, wherein determining whether the user interface comprises the set of user interface elements further comprises:
analyzing a document object model of the user interface;
identifying, based on the analyzing, a first set of object types and object labels associated with each user interface element on the user interface; and
comparing the first set of object types and object labels to a second set of object types and object labels associated with the set of user interface elements referenced by each test instruction.

5. The method of claim 1, wherein parsing each test instruction in the set of test instructions further comprises:

outputting a parsed object for each test instruction in the set of test instructions, wherein the parsed object comprises at least an action type and an object type of the parsed object.

6. A system comprising:
memory;
a processor communicatively coupled to the memory; and
a development and testing environment communicatively coupled to the memory and the processor, the development and testing environment configured to:
receive at least one test script associated with a user interface as an input, wherein the test script comprises a set of test instructions configured to test the user interface;
parse each test instruction in the set of test instructions;
identify, based on to each test instruction being parsed, a set of user interface elements associated with the user interface referenced by each test instruction;
determine whether the user interface comprises the set of user interface elements based on a document object model associated with the user interface;
generate, within the user interface, at least one user interface element in the set of user interface elements based on the user interface failing to comprise the at least one user interface element, the generating avoiding a failure of the at least one test script;
automatically positioning the user interface element that has been generated on the user interface wherein the user interface is automatically positioned on the user interface based on the user interface element being one of a first type that is used to arrange other user interface elements in the user interface and a second type that is used for interacting with users; and
execute the set of text instructions on the set of user interface elements including the at least one user interface element that has been generated.

7. The system of claim 6, wherein the development and testing environment is further configured to generate the user interface element by:
adding a set of source code for generating the user interface element to a source file of the user interface.

8. The system of claim 6, wherein the development and testing environment is further configured to determine whether the user interface comprises the set of user interface elements by:
analyzing a document object model of the user interface;
identifying, based on the analyzing, a first set of object types and object labels associated with each user interface element on the user interface; and
comparing the first set of object types and object labels to a second set of object types and object labels associated with the set of user interface elements referenced by each test instruction.

9. The system of claim 6, wherein the development and testing environment is further configured to parse each test instruction in the set of test instructions by:
outputting a parsed object for each test instruction in the set of test instructions, wherein the parsed object comprises at least an action type and an object type of the parsed object.

10. A computer program product for managing user interface elements, the computer program product comprising a computer readable storage medium having computer readable program code embodied therewith, the computer readable program code comprising computer readable program code configured to configured to test the user interface:
receive at least one test script associated with a user interface as an input, wherein the test script comprises a set of test instructions;
parse each test instruction in the set of test instructions;
identify, based on each test instruction being parsed, a set of user interface elements associated with the user interface referenced by each test instruction;
determine whether the user interface comprises the set of user interface elements based on a document object model associated with the user interface;
generate, within the user interface, at least one user interface element in the set of user interface elements based on the user interface failing to comprise the at least one user interface element, the generating avoiding a failure of the at least one test script;
automatically positioning the user interface element that has been generated on the user interface wherein the user interface is automatically positioned on the user interface based on the user interface element being one of a first type that is used to arrange other user interface elements in the user interface and a second type that is used for interacting with users; and
execute the set of text instructions on the set of user interface elements including the at least one user interface element that has been generated.

11. The computer program product of claim 10, wherein the computer readable program code is further configured to generate the user interface element by:
adding a set of source code for generating the user interface element to a source file of the user interface.

12. The computer program product of claim 10, wherein the computer readable program code is further configured to determine whether the user interface comprises the set of user interface elements by:
analyzing a document object model of the user interface;
identifying, based on the analyzing, a first set of object types and object labels associated with each user interface element on the user interface; and
comparing the first set of object types and object labels to a second set of object types and object labels associated with the set of user interface elements referenced by each test instruction.

13. The computer program product of claim 10, wherein the computer readable program code is further configured to parse each test instruction in the set of test instructions by:
outputting a parsed object for each test instruction in the set of test instructions, wherein the parsed object comprises at least an action type and an object type of the parsed object.

14. The computer program product of claim 10, wherein the computer readable program code is further configured to generate the user interface element by:
updating at least one meta-data file associated with the user interface to associate an object type with the user interface element, wherein the object type is identified from the set of test instructions.

* * * * *